United States Patent
Todorokihara (10) Patent No.: US 10,491,201 B2
(45) Date of Patent: Nov. 26, 2019

(54) DELAY CIRCUIT, COUNT VALUE GENERATION CIRCUIT, AND PHYSICAL QUANTITY SENSOR

(71) Applicant: Seiko Epson Corporation, Tokyo (JP)

(72) Inventor: Masayoshi Todorokihara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/840,203

(22) Filed: Dec. 13, 2017

(65) Prior Publication Data

US 2018/0175840 A1    Jun. 21, 2018

(30) Foreign Application Priority Data

Dec. 19, 2016  (JP) .................................. 2016-246005

(51) Int. Cl.
*H03K 5/14* (2014.01)
*H03K 21/10* (2006.01)
*H03K 19/21* (2006.01)

(52) U.S. Cl.
CPC ............... *H03K 5/14* (2013.01); *H03K 19/21* (2013.01); *H03K 21/10* (2013.01)

(58) Field of Classification Search
CPC ........... H03K 5/14; H03K 19/21; H03K 21/10
USPC ........................................................ 327/277
See application file for complete search history.

(56) References Cited

U.S. PATENT DOCUMENTS

| | | | |
|---|---|---|---|
| 4,458,165 A | 7/1984 | Jackson | |
| 5,416,444 A * | 5/1995 | Yamauchi | G01R 25/08 324/76.82 |
| 5,708,395 A * | 1/1998 | Yamauchi | H03L 7/0991 327/107 |
| 5,818,797 A * | 10/1998 | Watanabe | G04F 10/00 368/113 |
| 6,499,334 B1 | 12/2002 | Kobayashi | |
| 7,812,644 B2 * | 10/2010 | Cha | H03L 7/091 327/3 |
| 9,030,345 B2 * | 5/2015 | Kato | H03K 3/0315 331/57 |
| 9,231,613 B2 | 1/2016 | Todorokihara | |
| 2015/0333765 A1 | 11/2015 | Todorokihara | |

FOREIGN PATENT DOCUMENTS

| | | |
|---|---|---|
| JP | 59-181819 A | 10/1984 |
| JP | 2001-091587 A | 4/2001 |
| JP | 2009-088600 A | 4/2009 |
| JP | 2015-220552 A | 12/2015 |

* cited by examiner

*Primary Examiner* — Ryan Jager
(74) *Attorney, Agent, or Firm* — Harness, Dickey & Pierce, P.L.C.

(57) ABSTRACT

A delay circuit includes: a cyclic number control circuit that generates a third signal based on first and second signals generated based on a trigger signal; a loop circuit in which a plurality of delay elements are electrically connected in series, one output of outputs of the plurality of delay elements is fed back to form a loop, and the third signal is input to the delay element at an initial stage; and a latch circuit that latches output values of the plurality of delay elements as latch signals. The second signal is one output among the outputs of the plurality of delay elements. The loop circuit stops the feedback when a cyclic number of loops reaches a prescribed cyclic number.

15 Claims, 8 Drawing Sheets

DELAY CIRCUIT, COUNT VALUE GENERATION CIRCUIT, AND PHYSICAL QUANTITY SENSOR

BACKGROUND

1. Technical Field

The present invention relates to a delay circuit, a count value generation circuit, and a physical quantity sensor.

2. Related Art

There is known a frequency delta sigma modulation signal output device generating a delta sigma modulation signal which is a signal corresponding to a ratio of a frequency of reference signal (reference clock) to a frequency of a measurement signal.

The frequency delta sigma modulation signal output device includes a frequency delta sigma modulation unit (hereinafter referred to as a frequency delta sigma modulator (FDSM)). The FDSM performs frequency delta sigma modulation on the measurement signal using the reference signal to generate and output a delta sigma modulation signal.

In the frequency delta sigma modulation signal output device, periodic quantized noise called an idle tone occurs. That is, an output signal of the FDSM becomes a signal on which an idle tone is superimposed on a baseband signal component of the measurement signal.

JP-A-2015-220552 discloses a frequency delta sigma modulation signal output device that includes a plurality of FDSMs electrically connected in parallel to suppress an idle tone in a delta sigma modulation signal. In this device, an idle tone superimposed in an output signal of each FDSM is temporally distributed by inputting measurement signals of which phases deviate from each other to the plurality of FDSMs. Thus, it is possible to suppress quantized noise caused due to the idle tone superimposed on the delta sigma modulation signal, and thus improve an SN ratio of the delta sigma modulation signal. The device disclosed in JP-A-2015-220552 includes the same number of delay elements as the number of measurement signals in order to generate the plurality of measurement signals of which phases deviate from each other.

However, in the device disclosed in JP-A-2015-220552, there is a problem that a circuit scale increases since the delay elements and the FDSMs are necessary by the number of measurement signals generated by shifting phases. When an operation frequency is raised, precision is improved. However, when the operation frequency is raised, there is a problem that power consumption increases.

SUMMARY

An advantage of some aspects of the invention is that it provides a delay circuit, a count value generation circuit, and a physical quantity sensor in which a circuit scale can be reduced.

The invention can be implemented as the following forms or application examples.

A delay circuit according to an aspect of the invention includes: a cyclic number control circuit that generates a third signal based on first and second signals generated based on a trigger signal; a loop circuit in which a plurality of delay elements are electrically connected in series, one output of outputs of the plurality of delay elements is fed back to form a loop, and the third signal is input to the delay element at an initial stage; and a latch circuit that latches output values of the plurality of delay elements as latch signals. The second signal is one output among the outputs of the plurality of delay elements. The loop circuit stops the feedback when a cyclic number of loops reaches a prescribed cyclic number.

According to the aspect of the invention, a circuit scale can be decreased. That is, by circulating a loop of the loop circuit a plurality of times, it is possible to exert a function of a multiple of a cyclic number without increasing the circuit scale.

In the delay circuit according to the aspect of the invention, it is preferable that the cyclic number control circuit includes a binary counter, a multiplexer, an exclusive OR circuit, and an AND circuit.

With this configuration, it is possible to realize the cyclic number of an exponent of 2 simply.

It is preferable that the delay circuit according to the aspect of the invention further includes a selection unit that selects a predetermined output among the outputs of the plurality of delay elements, and the loop circuit feeds back the output selected by the selection unit.

With this configuration, it is possible to minutely adjust a delay amount.

In the delay circuit according to the aspect of the invention, it is preferable that a time necessary to circulate the loop once is longer than a latch interval of the latch circuit.

With this configuration, a phase at the time of latching by the latch circuit does not progress at 360° or more degrees. Thus, it is possible to simplify a process at the rear stage.

A count value generation circuit according to an aspect of the invention is a count value generation circuit counting a reference clock counted at a timing prescribed with the measurement signals and includes: a plurality of counters which are electrically connected in parallel, to which a plurality of measurement signals with different phases are respectively input, and which detect inversion edges indicating inversion of levels of the plurality of measurement signals using a reference clock; a count value generation unit that generates a count value based on outputs of the plurality of counters; and the delay circuit according to the aspect of the invention. The delay circuit generates the plurality of measurement signals with the different phases.

According to the aspect of the invention, a circuit scale can be decreased. That is, by circulating a loop of the loop circuit a plurality of times, it is possible to exert a function of a multiple of a cyclic number without increasing the circuit scale.

Since the phases of the plurality of measurement signals are caused to be different, power consumption can be reduced further than in a case in which the phases of the plurality of reference clocks are caused to be different.

By inputting the measurement signals with different phases to the counters, it is possible to suppress quantized noise caused due to an idle tone. Thus, it is possible to improve precision.

In the count value generation circuit according to the aspect of the invention, it is preferable that the count value is a reciprocal count value.

With this configuration, it is possible to improve precision.

A physical quantity sensor according to an aspect of the invention includes: a detection unit that detects a physical quantity; and the count value generation circuit according to the aspect of the invention to which a measurement signal output from the detection unit is input.

According to the aspect of the invention, a circuit scale can be decreased. That is, by circulating a loop of the loop circuit a plurality of times, it is possible to exert a function of a multiple of a cyclic number without increasing the circuit scale.

Since the phases of the plurality of measurement signals are caused to be different, power consumption can be reduced further than in a case in which the phases of the plurality of reference clocks are caused to be different.

By inputting the measurement signals with different phases to the counters, it is possible to suppress quantized noise caused due to an idle tone. Thus, it is possible to improve precision.

In the physical quantity sensor, it is preferable that the physical quantity is a physical quantity related to vibration.

With this configuration, it is possible to detect the physical quantity related to vibration with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a delay circuit, a count value generation circuit, and a physical quantity sensor according to the invention will be described in detail according to embodiments illustrated in the appended drawings.

Uses of the delay circuit are not particularly limited. The delay circuit can be applied to various circuits or devices. In the following embodiments, a case in which the delay circuit is applied to a reciprocal count value generation circuit (count value generation circuit) will be described as an example.

First Embodiment

Figure 1:
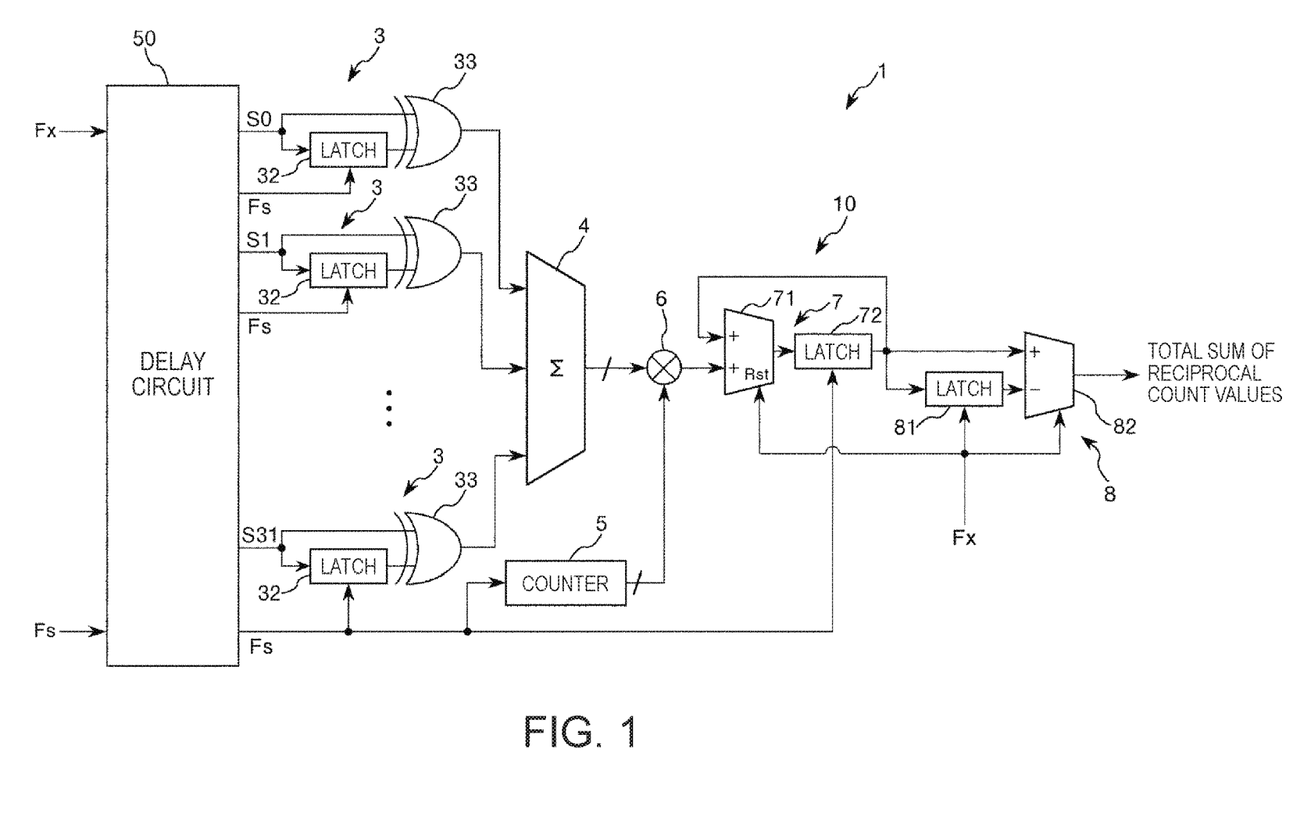
FIG. 1 is a block diagram illustrating a first embodiment of a reciprocal count value generation circuit which is one example of a count value generation circuit according to the invention.
Figure 2:
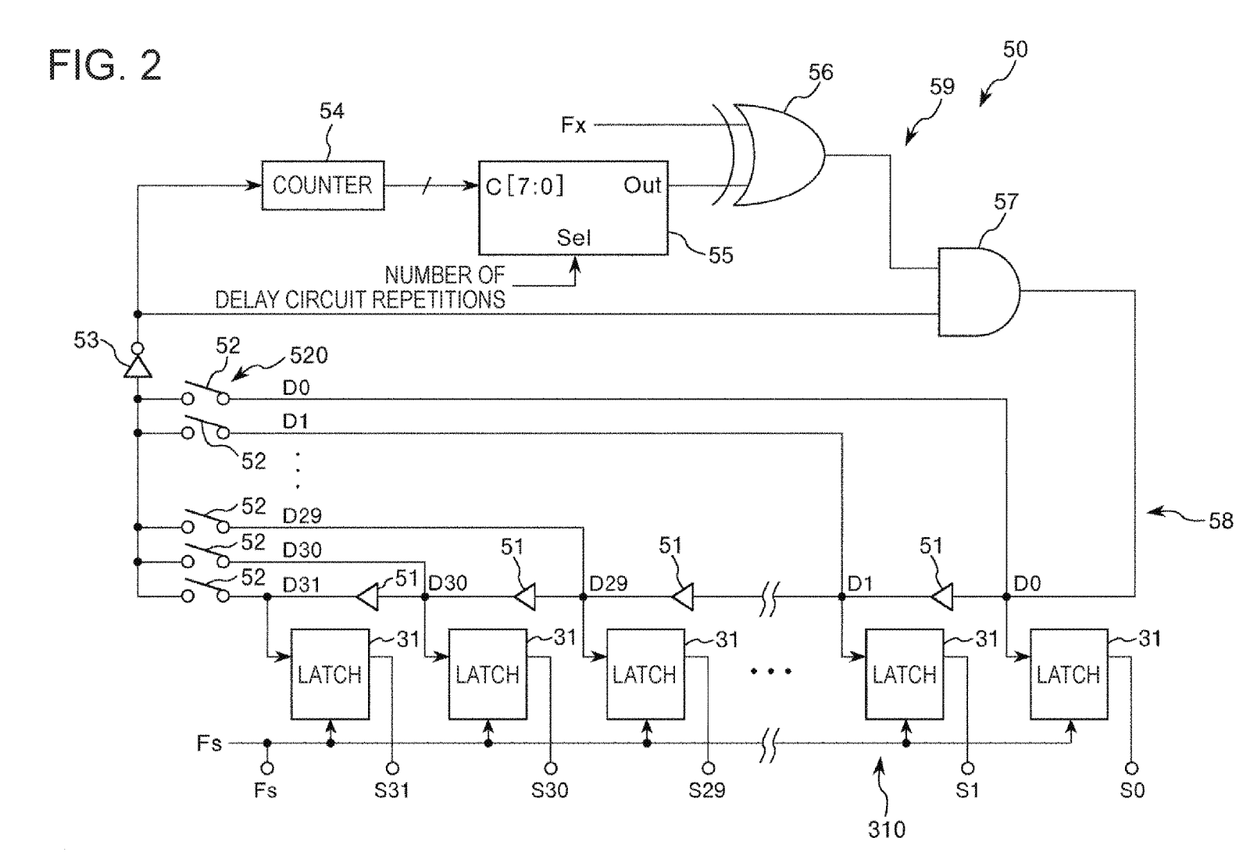
FIG. 2 is a block diagram illustrating a delay circuit of the reciprocal count value generation circuit illustrated in FIG. 1.

FIG. 1 is a block diagram illustrating a first embodiment of a reciprocal count value generation circuit which is one example of a count value generation circuit according to the invention. FIG. 2 is a block diagram illustrating a delay circuit of the reciprocal count value generation circuit illustrated in FIG. 1.

In the drawing, a measurement signal is denoted by "Fx", a measurement signal (a measurement signal immediately before input to a latch 31) output from an AND circuit 57 is denoted by "D", and a signal output from the latch 31 is denoted by "S". A reference clock (reference signal) is denoted by "Fs". A plurality of D and a plurality of S are distinguished from each other by appending suffixes (the same applies to the drawing of other embodiments).

In the following description, signals formed by causing phases of the measurement signals to be different are also referred to as "measurement signals". A case in which a level of a signal is "low" is referred to as "0" and a case in which a level of a signal is "high" is referred to as "1".

Inversion of a signal includes rising of the signal, that is, a case representing only a case in which the signal is changed from "0" to "1", falling of the signal, that is, a case representing only a case in which the signal is changed from "1" to "0", both rising and falling of the signal, that is, a case representing both the case in which the signal is changed from "0" to "1" and the case in which the signal is changed from "1" to "0".

An inversion edge of a signal is a portion representing inversion of a level of the signal. As described above, an inversion edge of a signal includes a case representing only a rising edge of the signal, a case representing only a falling edge of the signal, and a case representing both (both edges) of a rising edge and a falling edge of the signal.

In the following description, each of the reference clock (reference signal) and the measurement signal will be described exemplifying one of the foregoing cases. In the embodiment, for the reference clock, inversion of a signal is assumed to be rising of the signal. For the measurement signal, inversion of a signal is assumed to both of rising and falling of the signal.

A reciprocal count value generation circuit 1 (reciprocal count value generation device) which is one example of the count value generation circuit illustrated in FIG. 1 is circuit (device) that generates a reciprocal count value (a signal indicating a reciprocal count value) which is a value corresponding to a ratio of a frequency of the reference clock (reference signal) Fs with a known frequency to a frequency of the measurement signal Fx (or a value used to generate the foregoing value). In the reciprocal count value generation circuit 1, a reciprocal count scheme is adopted. The measurement signal is used as an operation clock and the frequency of the measurement signal is lower than the frequency of the reference clock.

First, an overview of the reciprocal count value generation circuit 1 will be described simply to correspond to the appended claims and then will be described in detail.

The reciprocal count value generation circuit 1 which is one example of the count value generation circuit is a circuit (reciprocal count value generation circuit) that counts the reference clock (Fs) at a timing prescribed with the measurement signal (Fx). The reciprocal count value generation circuit 1 includes a plurality of counters 3 which are electrically connected in parallel, to which the plurality of measurement signals (Fx) with different phases are input, and which detect inversion edges indicating inversion of levels of the plurality of measurement signals (Fx) using the reference clock (Fs); a reciprocal count value generation unit 10 which is one example of a count value generation unit generating a count value based on the outputs of the plurality of counters 3, and a delay circuit 50. The delay circuit 50 generates the plurality of measurement signals (fx) with different phases. Hereinafter, "electrical connection" is also simply referred to as "connection".

In the reciprocal count value generation circuit 1, a circuit scale can be decreased. That is, by circulating a loop of a loop circuit 58 of the delay circuit 50 to be described below a plurality of times, it is possible to exert a function of a multiple of a cyclic number without increasing the circuit scale.

Since the phases of the plurality of measurement signals are caused to be different, power consumption can be reduced further than in a case in which the phases of the plurality of reference clocks are caused to be different.

By inputting the measurement signals with different phases to the counters, it is possible to suppress quantized noise caused due to an idle tone. Thus, it is possible to improve precision.

As described above, in the embodiment, the reciprocal count value generation circuit 1 will be exemplified as the count value generation circuit. Therefore, a count value generated by the count value generation unit is a reciprocal count value generated by the reciprocal count value generation unit 10. Therefore, it is possible to improve precision. Hereinafter, specific description will be made.

As illustrated in FIGS. 1 and 2, the reciprocal count value generation circuit 1 includes the delay circuit 50, the plurality of counters 3 which are one example of a plurality of first counters, an adder 4, a counter 5 which is one example of a second counter, a multiplier 6, an integrator 7, and a differential arithmetic unit 8. The counters 3 are electrically connected in parallel. The number of counters 3 is not particularly limited as long as the number of counters 3 is plural, but the upper limit can be set to, for example, about 1000.

The counters 3, the adder 4, the multiplier 6, the integrator 7, and the differential arithmetic unit 8 are connected in this order from an input side to an output side.

In the embodiment, the counter 3 is configured as a frequency delta sigma modulation unit (hereinafter referred to as a "frequency delta sigma modulator (FDSM)").

That is, the counter 3 includes a latch 31 (first latch) (see FIG. 2) that latches the measurement signal Fx in synchronization with a rising edge of the reference clock (reference signal) Fs and outputs first data, a latch 32 (second latch) (see FIG. 1) that latches the first data in synchronization with a rising edge of the reference clock and outputs second data, and an exclusive OR circuit 33 (see FIG. 1) that calculates exclusive OR on the first data and the second data to generate output data. For example, D latches can be used as the latches 31 and 32. The latches 31 and 32 are configured with, for example, D flip-flop circuits.

The delay circuit 50 has a function of delaying the measurement signal and generates a plurality of measurement signals with different phases. The delay circuit 50 will be described in detail later.

The reference clock is input to an input terminal of the counter 5 and an output terminal of the counter 5 is connected to one input terminal of the multiplier 6. For example, a free-run counter can be used as the counter 5. An output terminal of the adder 4 is connected to the other input terminal of the multiplier 6.

The integrator 7 includes an adder 71 and a latch 72 electrically connected to an output side of the adder 71. For example, a D latch can be used as the latch 72.

The differential arithmetic unit 8 includes a latch 81 and a subtractor 82. An output terminal of the latch 81 is connected to an input terminal of a minus side of the subtractor 82. For example, a D latch can be used as the latch 81.

An output terminal of the latch 72 of the integrator 7 is connected to an input terminal of a plus side of the subtractor 82 of the differential arithmetic unit 8, an input terminal of the latch 81, and one input terminal of the adder 71. The output terminal of the multiplier 6 is connected to the other input terminal of the adder 71.

The adder 4, the multiplier 6, the integrator 7, and the differential arithmetic unit 8 configure main units of the reciprocal count value generation unit 10 (count value generation unit).

Next, the delay circuit 50 will be described.

The delay circuit 50 includes a cyclic number control circuit 59 that generates a third signal based on first and second signals generated based on the measurement signal (Fx) which is one example of a trigger signal, a loop circuit 58 in which a plurality of delay elements 51 are electrically connected in series and which forms a loop by feeding back an output of one of the plurality of delay elements 51 and inputs the third signal to the delay element 51 at the initial stage, and a latch circuit 310 that latches output values of the plurality of delay elements 51 with the clock signal (Fs) which is one example of a latch signal (see FIG. 2). The second signal is one of the outputs of the plurality of delay elements 51, that is, a signal input to an inverter 53 (or an output signal of the inverter 53). The loop circuit 58 stops the feedback when the cyclic number of loops of the loop circuit 58 reaches a prescribed cyclic number. In this configuration, a circuit scale can be reduced. That is, by circulating a loop of the loop circuit 58 a plurality of times, it is possible to exert a function of a multiple of a cyclic number without increasing the circuit scale. A signal output from an exclusive OR circuit 56 is one example of the first signal and a signal output from the AND circuit 57 is one example of the third example.

The cyclic number control circuit 59 includes a counter 11 (binary counter), a multiplexer 55, the exclusive OR circuit 56, and the AND circuit 57. Thus, it is possible to realize the cyclic number of an exponent of 2 simply.

The delay circuit 50 includes a selection unit 520 that selects a predetermined output (hereinafter also referred to as a "delay output") among the outputs of the plurality of delay elements 51. The loop circuit 58 feeds back the output selected by the selection unit 520. Thus, it is possible to minutely adjust a delay amount.

A time necessary to circulate the loop of the loop circuit 58 once is longer than a latch interval of the latch circuit 310. Thus, a phase at the time of latching by the latch circuit 310 does not progress at 360° degrees or more. Thus, it is possible to simplify a process at the rear stage. Hereinafter, specific description will be made.

As illustrated in FIG. 2, the delay circuit 50 includes a plurality of delay elements 51, a latch circuit 310 including a plurality of latches 31, a plurality of switches 52, an inverter 53, a counter 54, a multiplexer 55, the exclusive OR circuit 56, and the AND circuit 57 (AND circuit). The counter 54, the multiplexer 55, the exclusive OR circuit 56, the AND circuit 57, each delay element 51, each switch 52, and the inverter 53 configure main units of the loop circuit 58. The counter 54, the multiplexer 55, the exclusive OR circuit 56, and the AND circuit 57 configure main units of the cyclic number control circuit 59.

The delay elements 51 are electrically connected in series and each have a function of delaying the measurement signal. Accordingly, the measurement signal is delayed in sequence by each delay element 51. In the embodiment, a buffer is used as the delay element 51.

The number of delay elements 51 is less than the number of latches 31 (counters 3) by one. In the embodiment, the number of delay elements 51 is assumed to be 31 and the number of latches 31, that is, the number of counters 3, is assumed to be 32. Each latch 31 is assumed to belong to the delay circuit 50 and each counter 3.

The switches 52 are electrically connected in parallel. The number of switches 52 is the same as the number of latches 31 (the counters 3). In the embodiment, the number of switches 52 is assumed to be 32. The 32 switches 52 configure main units of the selection unit 520.

The counter 54 is not particularly limited. For example, a binary counter can be used. An output terminal of the counter 54 is connected to an input terminal of the multiplexer 55. In the multiplexer 55, the number of delay circuit repetitions is set. The number of delay circuit repetitions is the number of times a loop is circulated in the delay circuit 50. In the embodiment, a count value input from the counter 54 to the multiplexer 55 is represented by an 8-bit signal. The multiplexer 55 outputs a predetermined bit value of the 8-bit signal input from the counter 54. The predetermined bits output by the multiplexer 55 are set with a signal input to a selector (Sel) of the multiplexer 55. In the embodiment, as one example, the predetermined bits set in the selector are assumed to be 2 bits. In this case, the number of delay circuit repetitions is 4 times, and High and Low are output two times using inversion of the measurement signal as a trigger.

The measurement signal is input to one input terminal of the exclusive OR circuit 56 and an output terminal of the multiplexer 55 is connected to the other input terminal of the exclusive OR circuit 56.

An output terminal of the exclusive OR circuit 56 is connected to one input terminal of the AND circuit 57, and an output terminal of the inverter 53 is connected to an input terminal of the counter 54 and the other input terminal of the AND circuit 57.

An output terminal of the AND circuit 57 is connected to the input terminal of the delay element 51 at the initial stage among the plurality of delay elements 51, the input terminal of the corresponding latch 31 and the corresponding switch 52.

An output terminal of each delay element 51 is connected to the input terminal of the corresponding latch 31 and the corresponding switch 52.

The measurement signal is input to the one input terminal of the exclusive OR circuit 56 of the delay circuit 50, a reset terminal of the adder 71 of the integrator 7, and a clock input terminal of the latch 81 and a clock input terminal of the subtractor 82 of the differential arithmetic unit 8.

The reference clock is input to a clock input terminal of the latch 31 and a clock input terminal of a latch 32 of each counter 3, an input terminal of the counter 5, and a clock input terminal of the latch 72 of the integrator 7.

Next, an operation of the reciprocal count value generation circuit 1 will be described.

In the embodiment, a case in which the number of delay circuit repetitions is "4" will be described as one example.

As illustrated in FIGS. 1 and 2, the measurement signal (trigger signal) is input to the delay circuit 50, the reset terminal of the adder 71 of the integrator 7, and the clock input terminal of the latch 81 and the clock input terminal of the subtractor 82 of the differential arithmetic unit 8.

The reference clock which is an example of the latch signal is input to the delay circuit 50. Then, the reference clock is input to the clock input terminal of the latch 31 and the clock input terminal of a latch 32 of each counter 3, the input terminal of the counter 5, and the clock input terminal of the latch 72 of the integrator 7.

First, an operation of the delay circuit 50 will be described.

As illustrated in FIG. 2, the measurement signal is input to the one input terminal of the exclusive OR circuit 56. In an initial state, for example, a count value output of the counter 54 is assumed to be "0" and a signal input from the multiplexer 55 to the other input terminal of the exclusive OR circuit 56 is assumed to be "0" which is a value of a low-order second bit.

First, when the measurement signal is "1", a signal "1" is output from the exclusive OR circuit 56 and the signal "1" is input to one input terminal of the AND circuit 57. The signal output from the exclusive OR circuit 56 is one example of the first signal.

In the initial state, for example, a signal input to the other input terminal of the AND circuit 57 is assumed to be "1". In this case, the signal "1" is output from the AND circuit 57. The signal output from the AND circuit 57 is one example of the third signal.

One of the plurality of switches 52 is turned on (closed) and the other switches are turned off (opened). The switches 52 can be selectively turned on or off (which switch is turned on) by operating an operation unit (not illustrated). By selectively turning on or off the switch 52, it is possible to set a time necessary to circulate the loop of the loop circuit 58 once. That is, when the switch 52 to be turned on is selected, a predetermined measurement signal (delay output) is selected from the plurality of measurement signals (plurality of delay outputs) with different phases and is fed back.

The time necessary to circulate the loop of the loop circuit 58 once is preferably set to be longer than a latch interval of the latch circuit 310. Thus, a phase at the time of latching by the latch circuit 310 is prevented from progressing at 360° or more degrees. Thus, it is possible to simplify a process at the rear stage.

Subsequently, the signal "1" output from the AND circuit 57 passes through the switch 52 turned on among the plurality of switches 52, is inverted to "0" by the inverter 53, and is input to the counter 54. The signal output from the AND circuit 57 and input to the inverter 53 is delayed by the delay elements 51 disposed between the AND circuit 57 and the inverters 53, and thus a delay amount of the signal is a value corresponding to the number of delay elements 51. The signal inverted by the inverter 53 is one example of the second signal.

Subsequently, the counter 54 performs counting and outputs a count value as an 8-bit signal to the multiplexer 55. Since the signal input to the counter 54 is "0", the count value is "0".

The multiplexer 55 outputs the value of the lower-order second bit of the input signal. Therefore, the signal "0" is output to the other input terminal of the exclusive OR circuit 56. Thus, the signal "1" is output from the exclusive OR circuit 56 and is input to the one input terminal of the AND circuit 57.

The signal "0" output from the inverter 53 is input to the other input terminal of the AND circuit 57. Thus, the signal "0" is output from the AND circuit 57.

Subsequently, the signal "0" output from the AND circuit 57 passes through the switch 52 turned on among the plurality of switches 52, is inverted to "1" by the inverter 53, and is input to the counter 54. The counter 54 performs counting and outputs the count value "1" as an 8-bit signal to the multiplexer 55.

The multiplexer 55 outputs the value of the lower-order second bit of the input signal, that is, the signal "0". Thus, the signal "1" is output from the exclusive OR circuit 56 and is input to the one input terminal of the AND circuit 57.

The signal "1" output from the inverter 53 is input to the other input terminal of the AND circuit 57. Thus, the signal "1" is output from the AND circuit 57.

Subsequently, the signal "1" output from the AND circuit 57 passes through the switch 52 turned on among the plurality of switches 52, is inverted to "0" by the inverter 53, and is input to the counter 54. The counter 54 performs counting. However, since the signal input to the counter 54 is "0", the count value remains unchanged as "1". That is, the counter 54 outputs the count value "1" as an 8-bit signal to the multiplexer 55.

The multiplexer 55 outputs the value of the lower-order second bit of the input signal, that is, the signal "0". Thus, the signal "1" is output from the exclusive OR circuit 56 and is input to the one input terminal of the AND circuit 57.

The signal "0" output from the inverter 53 is input to the other input terminal of the AND circuit 57. Thus, the signal "0" is output from the AND circuit 57.

Subsequently, the signal "0" output from the AND circuit 57 passes through the switch 52 turned on among the plurality of switches 52, is inverted to "1" by the inverter 53, and is input to the counter 54. The counter 54 performs counting and outputs the count value "2" as an 8-bit signal to the multiplexer 55.

The multiplexer 55 outputs the value of the lower-order second bit of the input signal, that is, the signal "1". Thus, the signal "0" is output from the exclusive OR circuit 56. As described above, the cyclic number of the loop of the loop circuit 58 is "4" which is a prescribed cyclic number, the feedback of the measurement signal (the delay output) stops, and the operation ends.

In the embodiment, the delay circuit 50 is configured such that the number of delay circuit repetitions is set to one value of an exponent of 2, but the invention is not limited thereto. The delay circuit 50 may be configured such that any value can be set.

On the other hand, while the loop of the loop circuit 58 is circulated, the measurement signal output from the AND circuit 57 is input to the input terminal of the latch 31 of a predetermined counter 3 (at the initial stage) among the plurality of counters 3 and the input terminal of the delay element 51 (at the initial stage) among the plurality of delay elements 51. The measurement signal is delayed by each delay element 51, as described above, and is input to the input terminal of the latches 31 of the other counters 3.

Thus, The measurement signals (D0 to D31) with the same frequency and different phases are input to the input terminals of the latches 31 of the counters 3. By circulating the loop of the loop circuit 58 once, it is possible to obtain measurement signals with the same frequency and the different phases. In the embodiment, by circulating the loop of the loop circuit 58 four times, it is possible to obtain 128 (which is a number when half a cycle is set to one) measurement signals with the same frequency and the different phases. The number of delay circuit repetitions can be set to any number, as described above. By circulating the loop of the loop circuit 58 N times (where N is an integer equal to or greater than 1), it is possible to obtain (32×N) measurement signals with the same frequency and different phases.

In each counter 3, the latch 31 latches the measurement signal in synchronization with a rising edge of the reference clock and outputs the first data, the latch 32 latches the first data in synchronization with a rising edge of the reference clock and outputs the second data, and the exclusive OR circuit 33 performs exclusive OR on the first data and the second data to generate output data and outputs the output data. The rising edge of the reference clock is one example of a latch signal. That is, when the number of inversions of the measurement signal is even during transition of the reference clock for one period, the exclusive OR circuit 33 outputs "0". When the number of inversions of the measurement signal is odd, the exclusive OR circuit 33 outputs "1". Thus, each counter 3 outputs "1" to correspond to the rising and falling of the measurement signal. Otherwise, each counter 3 outputs "0".

The signal output from each counter 3 is input to the adder 4. The adder 4 adds and outputs the numerical values indicated by the signals output from the counters 3.

The counter 5 counts the reference clock and outputs the count value of the reference clock.

Subsequently, the multiplier 6 multiplies the numerical value output from the adder 4 by the count value output from the counter 5 and outputs the multiplied value.

Subsequently, in the integrator 7, the adder 71 adds the current multiplied value and the immediately previous multiplied value latched in the latch 72 and outputs the added value. This output is a total sum of the integrated reciprocal count values.

Subsequently, in the differential arithmetic unit 8, the subtractor 82 subtracts a value indicated by the immediately previous signal latched in the latch 81 from a value indicated by the signal output from the current integrator 7 and outputs the subtracted value. This output is a total sum of the reciprocal count values. When the total sum of the reciprocal count values is divided by the number of counters 3, a reciprocal count value corresponding to one counter 3 can be obtained.

Here, the reciprocal count value in the embodiment is a value equivalent to an output of one of the plurality of counters 3 and is the number of rising edges of the reference clock included between the rising edge and the falling edge of the measurement signal.

The total sum of the reciprocal count values is a sum value of the reciprocal count values obtained from the outputs of all the counters 3.

The reciprocal count values according to the invention are not limited to the reciprocal count values in a narrow sense in the embodiment, but may be a total sum of the reciprocal count values, integrated reciprocal count values, a total sum of the integrated reciprocal count values.

The detailed description of a subsequent operation will be omitted. For example, a lowpass filter (filter) (not illustrated) is provided on the output side of the differential arithmetic unit 8. The lowpass filter performs a process on a signal output from the differential arithmetic unit 8. Thus, a frequency component equal to or greater than a predetermined cutoff frequency is cut off or reduced by the lowpass filter. For example, a moving average filter may be provided.

The case in which the number of delay circuit repetitions of the delay circuit 50 is assumed to be "4" has been described above. However, by increasing the number of delay circuit repetitions, it is possible to improve precision. That is, it is possible to further improve the precision compared to a circuit with the same circuit scale.

As described above, in the reciprocal count value generation circuit 1, the phases of the plurality of measurement signals are different. Therefore, it is possible to further reduce power consumption compared to a case in which phases of a plurality of reference clocks with high frequencies are different.

By inputting the measurement signals with different phases to the counters 3, it is possible to suppress quantized noise caused due to an idle tone. Thus, it is possible to improve the precision.

It is possible to perform the counting without being missed and without a dead period, it is possible to obtain a primary noise shaping effect, and thus it is possible to effectively shift noise to a high-frequency side. Thus, for example, by providing the lowpass filter on the output side, it is possible to reduce a noise component. Thus, it is possible to improve the precision. For example, when a moving average filter is provided on the output side, it is possible to simplify the configuration of the moving average filter or a moving average filter process.

By providing the delay circuit 50, it is possible to reduce the circuit scale when the same precision is achieved. That is, by circulating the loop of the loop circuit 58 a plurality of times, it is possible to exert the function of a multiple of a cyclic number without increasing the circuit scale.

Modification examples will be described below.

(1) The invention is not limited to the foregoing configurations of the counters 3 and 5, but counters with another configuration can be used. For example, a ripple counter can be exemplified as another counter.

(2) The frequency of the measurement signal may be higher than the frequency of the reference clock.

(3) In a circuit at the rear stage (on the output side) of the differential arithmetic unit 8 (edge detection number arithmetic circuit), the reference clock or the measurement signal may be used as an operation clock.

(3-1) In a circuit at the rear stage of the differential arithmetic unit 8 (edge detection number arithmetic circuit), the reference clock may be used as an operation clock.

Thus, when the frequency of the reference clock is higher than the frequency of the measurement signal, it is possible to reliably end the arithmetic operation within a time while distributing the process.

(3-2) In a circuit at the rear stage of the differential arithmetic unit 8 (edge detection number arithmetic circuit), the measurement signal may be used as an operation clock.

Thus, when the frequency of the reference clock is lower than the frequency of the measurement signal, it is possible to reduce power consumption through pipeline processing at a clock with a low frequency.

Second Embodiment

Figure 3:
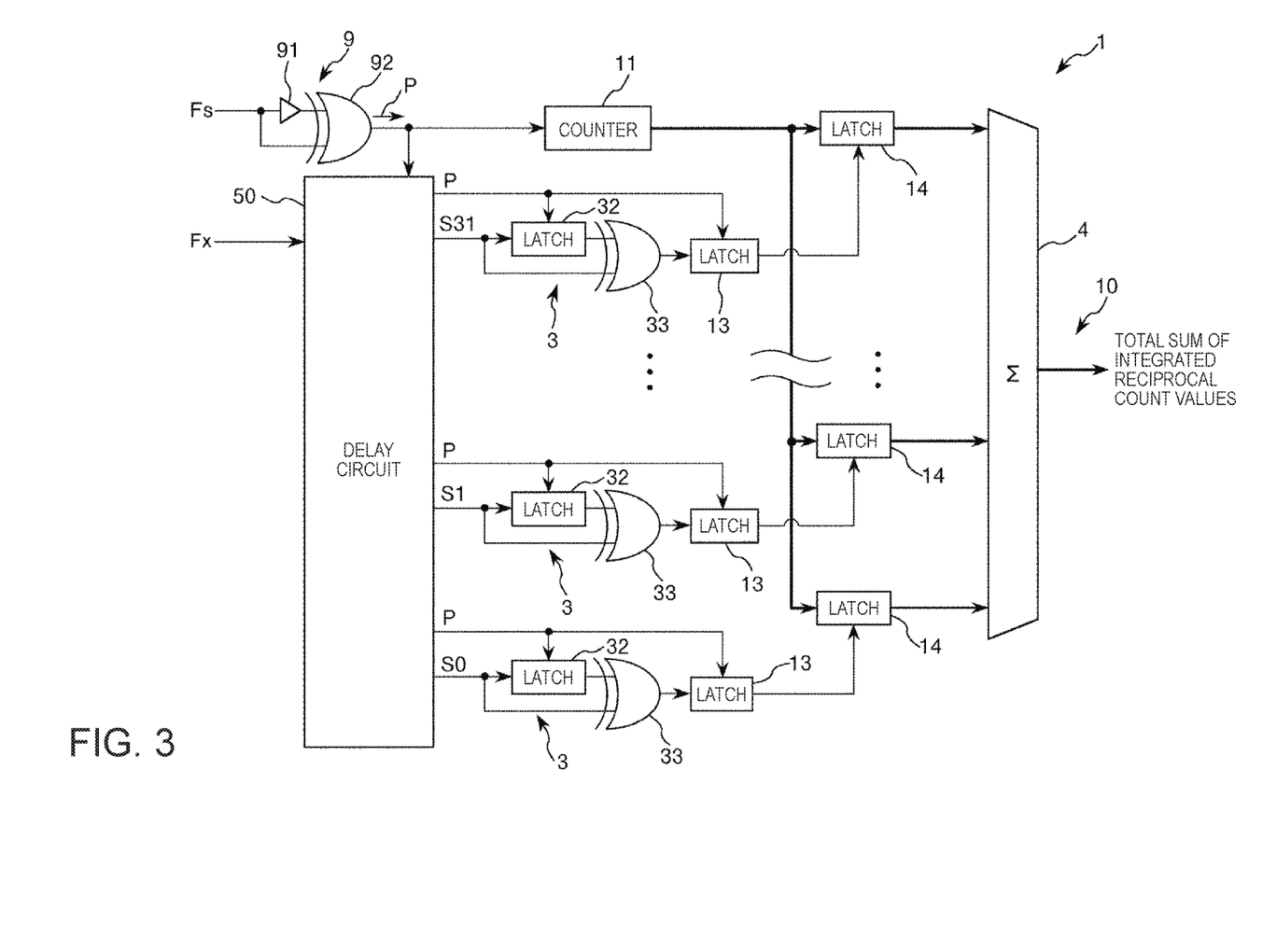
FIG. 3 is a block diagram illustrating a second embodiment of the reciprocal count value generation circuit which is one example of the count value generation circuit according to the invention.
Figure 4:
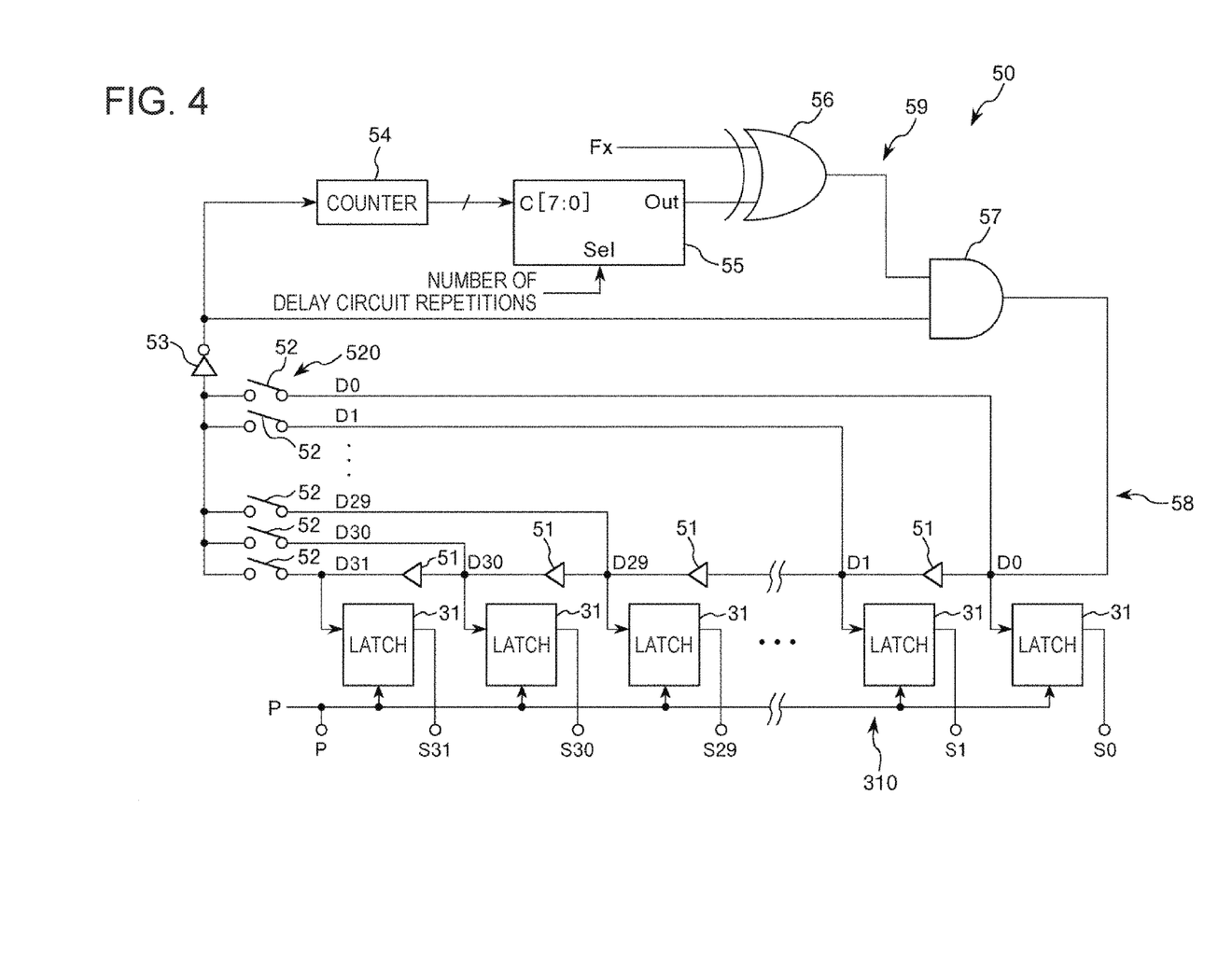
FIG. 4 is a block diagram illustrating a delay circuit of the reciprocal count value generation circuit illustrated in FIG. 3.
Figure 5:
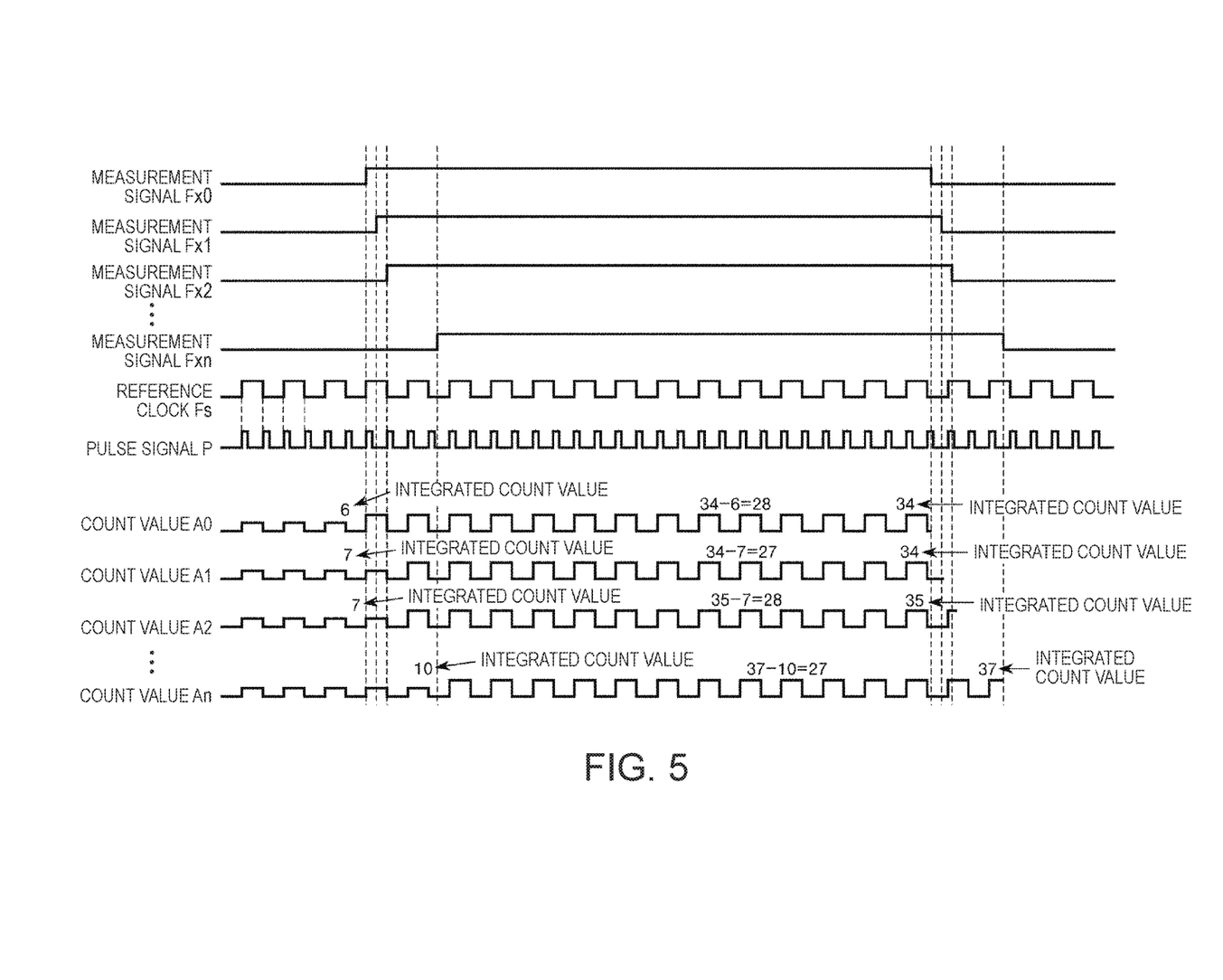
FIG. 5 is a timing chart illustrating an operation of the reciprocal count value generation circuit illustrated in FIG. 3.

FIG. 3 is a block diagram illustrating a second embodiment of the reciprocal count value generation circuit which is one example of the count value generation circuit according to the invention. FIG. 4 is a block diagram illustrating a delay circuit of the reciprocal count value generation circuit illustrated in FIG. 3. FIG. 5 is a timing chart illustrating an operation of the reciprocal count value generation circuit illustrated in FIG. 3. In FIG. 3, a bus in a circuit is indicated by a thick line (the same applies to other drawings).

In the drawings, to distinguish measurement signals with different phases from each other, suffixes (0, 1, ..., and 31) are appended to "Fx" (the same applies to the drawings of other embodiments). A reference clock is denoted by "Fs" and a pulse signal that has a pulse synchronized with a rising edge of the reference clock and a pulse synchronized with a falling edge of the reference clock is denoted by "P" (the same applies to the drawings of other embodiments).

Hereinafter, the second embodiment will be described focusing on differences from the above-described embodiment. The description of the same matters will be omitted.

In the second embodiment, for the reference clock and the measurement signal, inversion of a signal occurs in both rising and falling of the signal.

That is, in the second embodiment, a counter 3 (first counter) detects an inversion edge using a rising edge and a falling edge of the reference clock (Fs) and a counter 11 (second counter) counts the reference clock (Fs) using a rising edge and a falling edge of the reference clock (Fs).

Thus, double frequencies can be counted effectively, and thus it is possible to improve an SN ratio.

More specifically, a reciprocal count value generation circuit 1 according to the second embodiment includes an edge detection unit 9 which is one example of a detection circuit detecting rising and falling of the reference clock (Fs) and generating the pulse signal (P) synchronized with the rising and falling of the reference clock (Fs). The counter 3 (the first counter) detects an inversion edge using the pulse signal (P) generated by the edge detection unit 9. The counter 11 (the second counter) counts the reference clock (Fs) using the pulse signal (P) generated by the edge detection unit 9.

Thus, double frequencies can be counted effectively with the simple configuration, and thus it is possible to improve an SN ratio. Hereinafter, specific description will be made.

As illustrated in FIGS. 3 and 4, the reciprocal count value generation circuit 1 according to the second embodiment includes the edge detection unit 9, the counter 11 which is one example of a second counter, the delay circuit 50, the plurality of counters 3 which are one example of a plurality of first counters, a plurality of latches 13, and a plurality of latches 14, and an adder 4. The counters 3 are electrically connected in parallel.

The edge detection unit 9, the counter 11, the latches 14, the adder 4 are connected in this order from an input side to an output side.

The edge detection unit 9 includes a delay element 91 and an exclusive OR circuit 92. An output terminal of the delay element 91 is connected to one input terminal of the exclusive OR circuit 92. In the embodiment, a buffer is used as the delay element 91.

An output terminal of the edge detection unit 9 is connected to an input terminal of the counter 11 and an output terminal of the counter 11 is connected to an input terminal of each latch 14. Output terminals of the latches 14 are connected to an input terminal of the adder 4. For example, an up-counter can be used as the counter 11.

The output terminal of the edge detection unit 9 is connected to a clock input terminal of the latch 31 and a clock input terminal of the latch 32 of each counter 3 and a clock input terminal of each latch 13. An output terminal of each latch 13 is connected to a clock input terminal of each latch 14.

An output terminal of each counter 3 is connected to an input terminal of the latch 13 corresponding to the counter 3. The output terminal of each latch 13 is connected to the clock input terminal of the latch 14 corresponding to the latch 13. For example, D latches can be used as the latches 13 and 14.

As illustrated in FIG. 4, the delay circuit 50 includes a plurality of delay elements 51, a plurality of latches 31, a plurality of switches 52, an inverter 53, a counter 54, a multiplexer 55, an exclusive OR circuit 56, and an AND circuit 57. The delay circuit 50 is the same as that of the first embodiment, and thus the description thereof will be omitted.

A measurement signal is input to one input terminal of the exclusive OR circuit 56 of the delay circuit 50.

A reference clock is input to an input terminal of the delay element 91 connected to one input terminal of the exclusive OR circuit 92 and the other input terminal of the exclusive OR circuit 92 of the edge detection unit 9.

Next, an operation of the reciprocal count value generation circuit 1 will be described.

The operation of the delay circuit 50 is the same as that of the first embodiment, and thus the description thereof will be omitted.

As illustrated in FIGS. 3 and 4, the measurement signal is input to one input terminal of the exclusive OR circuit 56 of the delay circuit 50. The reference clock is input to the input terminal of the delay element 91 connected to one input terminal of the exclusive OR circuit 92 and the other input terminal of the exclusive OR circuit 92 of the edge detection unit 9.

Then, the measurement signals with the same frequency and different phases are input from the delay circuit 50 to the input terminals of the latches 31 of the counters 3 (see FIG. 5).

The edge detection unit 9 detects a rising edge and a falling edge of the reference clock (Fs). That is, the edge detection unit 9 outputs a pulse signal (P) that has a pulse synchronized with the rising edge of the reference clock (Fs) and a pulse synchronized with the falling edge of the reference clock (Fs). The pulse signal (P) is one example of a latch signal.

The pulse signal (P) output from the edge detection unit 9 is input to the counter 11. The counter 11 counts pulses of the pulse signal (P) output from the edge detection unit 9 and outputs a count value of the pulses.

The pulse signal (P) is input to the clock input terminal of the latch 31 and the clock input terminal of the latch 32 of each counter 3 and the clock input terminal of the latch 13.

In the counters 3, the latches 31 latch measurement signals (Fx0 to Fx31) in synchronization with the rising edge of the reference clock (the rising edge of the pulse of the pulse signal output from the edge detection unit 9) and output the first data, the latches 32 latch the first data in synchronization with the rising edge of the reference clock and output the second data, and the exclusive OR circuits 33 performs exclusive OR on the first data and the second data to generate output data and output the output data. In the counters 3, the latches 31 latch the measurement signals in synchronization with the falling edge of the reference clock and output the first data, the latches 32 latch the first data in synchronization with the falling edge of the reference clock and output the second data, and the exclusive OR circuit 33 performs exclusive OR on the first data and the second data to generate output data and output the output data. That is, each counter 3 outputs "1" to correspond to the rising and falling of the measurement signal. Otherwise, each counter 3 outputs "0".

The signal output from each counter 3 is latched and output in synchronization with the rising edge and the falling edge of the reference clock by the latch 13.

The count value output from the counter 11 is input to each latch 14. Each latch 14 latches and outputs the count value in synchronization with the rising edge of the signal output from the latch 13.

In the example illustrated in FIG. 5, the count value output from the latch 14 of a predetermined counter 3 among the counters 3 is "6" at the rising of the measurement signal and is "34" at the falling of the measurement signal. That is, when only this counter 3 is focused on, the integrated reciprocal count value is "6" and "34" and the reciprocal count value is 28 (=34−6).

The count value output from the latch 14 of another counter 3 is "7" at the rising of the measurement signal and is "34" at the falling of the measurement signal. That is, when only this counter 3 is focused on, the integrated reciprocal count value is "7" and "34" and the reciprocal count value is 27 (=34−7).

The count value output from the latch 14 of still another counter 3 is "7" at the rising of the measurement signal and is "35" at the falling of the measurement signal. That is, when only this counter 3 is focused on, the integrated reciprocal count value is "7" and "35" and the reciprocal count value is 28 (=35−7).

The count value output from the latch 14 of still another counter 3 is "10" at the rising of the measurement signal and is "37" at the falling of the measurement signal. That is, when only this counter 3 is focused on, the integrated reciprocal count value is "10" and "37" and the reciprocal count value is 27 (=37−10).

Subsequently, the adder 4 adds and outputs the count value output from the latches 14. This output is a total sum of the integrated reciprocal count values.

Here, the reciprocal count value in the embodiment is a value equivalent to an output of one of the plurality of counters 3 and is the number of rising edges and falling edges of the reference clock included between the rising edge and the falling edge of the measurement signal.

A total sum of the reciprocal count values is a sum value of the reciprocal count values obtained from the outputs of all the counters 3.

The detailed description of a subsequent operation will be omitted. However, for example, a difference between the total sum of the current integrated reciprocal count values and the total sum of the immediately previous integrated reciprocal count values is obtained and output. This output is a total sum of the reciprocal count values. A method of obtaining the total sum of the reciprocal count values is not limited to this method and another method may be used. As described in the first embodiment, for example, a filter such as a lowpass filter or a moving average filter may be provided.

Even in the foregoing second embodiment, it is possible to obtain the same advantages as those of the above-described embodiment.

In the second embodiment, since inversion of the signal is prescribed in both the rising and the falling of the signal as for not only the measurement signal but also the reference clock, it is possible to further improve the precision.

Third Embodiment

Figure 6:
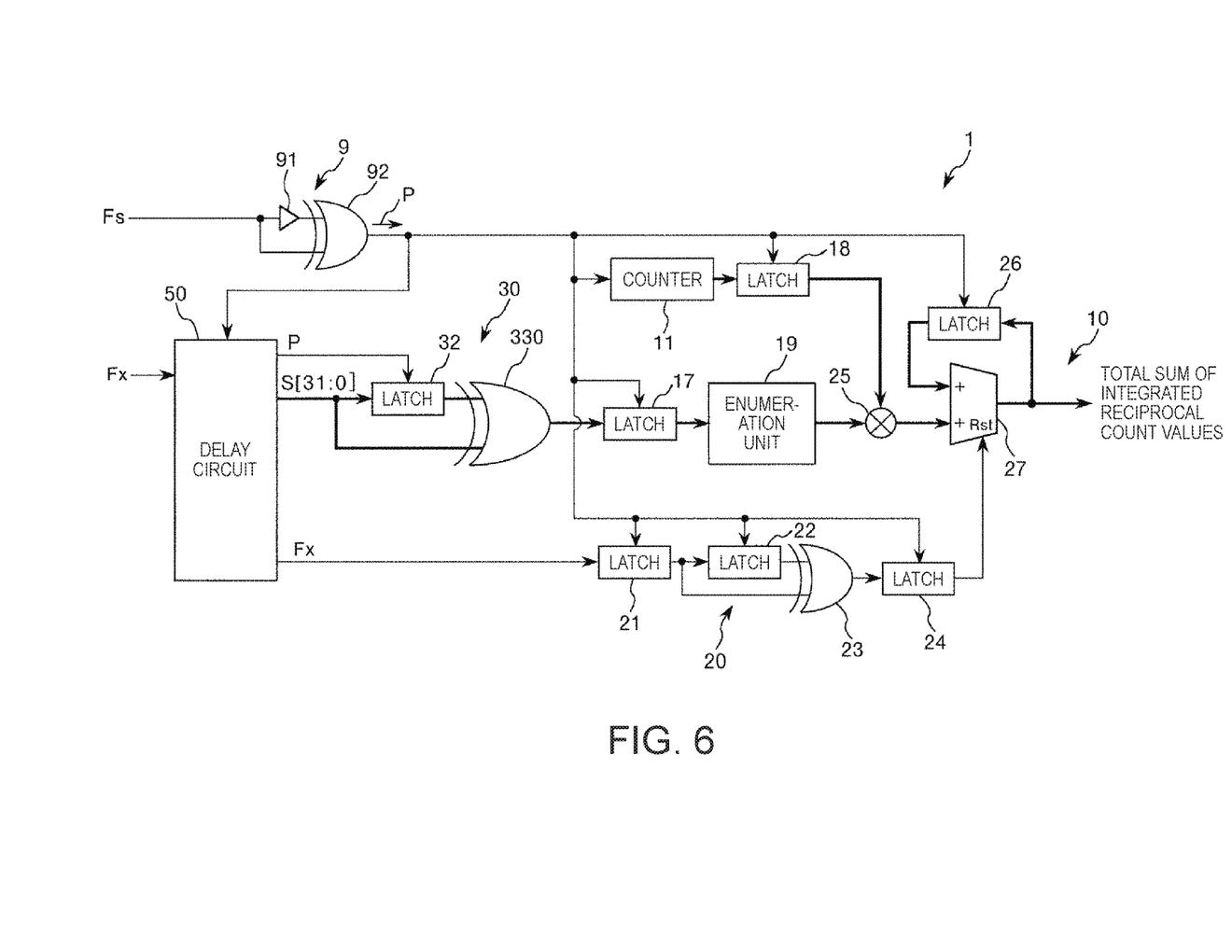
FIG. 6 is a block diagram illustrating a third embodiment of the reciprocal count value generation circuit which is one example of the count value generation circuit according to the invention.

FIG. 6 is a block diagram illustrating a third embodiment of the reciprocal count value generation circuit 1 which is one example of the count value generation circuit according to the invention.

Hereinafter, the third embodiment will be described focusing on differences from the above-described embodiment. The description of the same matters will be omitted.

In the third embodiment, for the reference clock and the measurement signal, inversion of a signal occurs in both rising and falling of the signal.

As illustrated in FIG. 6, a reciprocal count value generation circuit 1 according to the third embodiment includes an edge detection unit 9, a delay circuit 50, a counter 11 which is one example of a second counter, a latch 18, counters 30 (only one counter is illustrated in the drawing) which are one example of a plurality of first counters, a plurality of latches (only one latch is illustrated in the drawing), an enumeration unit 19, a multiplier 25, a counter 20, a latch 24, a latch 26, and an adder 27. The edge detection unit 9 and the delay circuit 50 are the same as those of the first or second embodiment, and thus the description thereof will be omitted.

In the embodiment, the counters 30 are the same as the 32 counters 3 of the second embodiment. One counter represents the 32 counters 3 (has functions of the 32 counters 3).

That is, latches 32 are the same as the 32 latches 32 of the second embodiment. One latch represents the 32 latches 32. The 32 latches 31 are illustrated in FIG. 4.

Similarly, exclusive OR circuits 330 are the same as the 32 exclusive OR circuits 33 of the second embodiment. One exclusive OR circuit represents the 32 exclusive OR circuits 33.

Similarly, the latches 17 are the same as the 32 latches 14 of the second embodiment. One latch 17 represents the 32 latches 14. Accordingly, the description of the counter 30 and the latch 17 will be omitted.

The counter 30, the latch 17, the enumeration unit 19, the multiplier 25, and the adder 27 are connected in this order from an input side to an output side. The enumeration unit 19 has a function of enumerating bits "1"s.

The edge detection unit 9, the counter 11, the latch 18, and the multiplier 25 are connected in this order from an input side to an output side.

The counter 20 and the latch 24 are connected in this order from an input side to an output side.

The counter 20 includes a latch 21, a latch 22, and an exclusive OR circuit 23 and has the same configuration as the counter 3 of the first and second embodiments. The measurement signal is input to an input terminal of the latch 21 of the counter 20.

For example, D latches can be used as the latch 17, the latches 18, 21, 22, and 26.

The output terminal of the edge detection unit 9 is connected to a clock input terminal of each latch 31 and a clock input terminal of each latch 32 of the counter 30, the input terminal of the counter 11, a clock input terminal of the latch 18, a clock input terminal of the latch 26, a clock input terminal of each latch 17, a clock input terminal of the latch 21 and a clock input terminal of the latch 22 of the counter 20, and a clock input terminal of the latch 24 (see FIGS. 4 and 6).

The output terminal of the edge detection unit 9 is connected to a clock input terminal of each latch (not illustrated) equivalent to each latch 31 of the second embodiment and a clock input terminal of each latch 32 of the counter 30, the input terminal of the counter 11, the clock input terminal of the latch 18, the clock input terminal of the latch 26, the clock input terminal of each latch 17, the clock input terminal of the latch 21 and the clock input terminal of the latch 22 of the counter 20, and the clock input terminal of the latch 24.

An output terminal of the multiplier 25 is connected to one input terminal of the adder 27. An output terminal of the adder 27 is connected to an input terminal of the latch 26 and an output terminal of the latch 26 is connected to the other input terminal of the adder 27. An output terminal of the latch 24 is connected to a reset terminal of the adder 27.

The measurement signal is input to one input terminal of the exclusive OR circuit 56 of the delay circuit 50 (see FIG. 4).

A reference clock is input to an input terminal of the delay element 91 connected to one input terminal of the exclusive OR circuit 92 and the other input terminal of the exclusive OR circuit 92 of the edge detection unit 9.

Next, an operation of the reciprocal count value generation circuit 1 will be described.

As illustrated in FIG. 6, the operation is the same as that of the second embodiment until an operation performed halfway. The exclusive OR circuit 330 of the counter 30 outputs "1" to correspond to the rising and falling of the measurement signal. Otherwise, the exclusive OR circuit 330 outputs "0".

The pulse signal that is output from the edge detection unit 9 and has the pulse synchronized with the rising edge of the reference clock and the pulse synchronized with the falling edge of the reference clock is input to the counter 11, the clock input terminal of the latch 18, the clock input terminal of the latch 26, the clock input terminal of the latch 17, the clock input terminal of the latch 21 and the clock input terminal of the latch 22 of the counter 20, and the clock input terminal of the latch 24.

The signal output from the counter 30 is latched and output in synchronization with the rising edge of the reference clock (the rising edge of the pulse of the pulse signal output from the edge detection unit 9) by the latch 17.

Subsequently, the enumeration unit 19 enumerates bits "1"s of the signal output from the counter 30. That is, the enumeration unit 19 counts the number of "1"s of the signal output from the counter 30 at the time of each count value of the counter 11.

The count value output from the counter 11 is input to the latch 18. The latch 18 latches and outputs the count value in synchronization with the rising edge of the reference clock (the rising edge of the pulse of the pulse signal output from the edge detection unit 9).

Subsequently, the multiplier 25 multiplies the numerical value output from the enumeration unit 19 by the count value of the counter 11 output from the latch 18 and outputs the multiplied value. The multiplied value is input to one input terminal of the adder 27.

In the counter 20, the latch 21 latches the measurement signal in synchronization with the rising edge of the reference clock (the rising edge of the pulse of the pulse signal output from the edge detection unit 9) and outputs the first data, the latch 22 latches the first data in synchronization with the rising edge and the falling edge of the reference clock and outputs the second data, and the exclusive OR circuit 23 performs exclusive OR on the first data and the second data to generate output data and output the output data. That is, the counter 20 outputs "1" to correspond to the rising and falling of the measurement signal. Otherwise, the counter 20 outputs "0".

The signal output from the counter 20 is latched and output in synchronization with the rising edge and the falling edge of the reference clock by the latch 24 to be input to the reset terminal of the adder 27.

The multiplied value output from the multiplier 25 is input to the one input terminal of the adder 27. The output of the adder 27 is latched and output in synchronization with the rising edge and the falling edge of the reference clock by the latch 26 to be input to the other input terminal of the adder 27.

The adder 27 adds the current multiplied value and the immediately previous multiplied value latched by the latch 26 and outputs the added value. This output is a total sum of the integrated reciprocal count values.

The detailed description of a subsequent operation will be omitted. However, for example, a difference between the total sum of the current integrated reciprocal count values and the total sum of the immediately previous integrated reciprocal count values is obtained and output. This output is a total sum of the reciprocal count values. A method of obtaining the total sum of the reciprocal count values is not limited to this method and another method may be used. As described in the first embodiment, for example, a filter such as a lowpass filter or a moving average filter may be provided.

Even in the foregoing third embodiment, it is possible to obtain the same advantages as those of the above-described embodiment.

Fourth Embodiment

Figure 7:
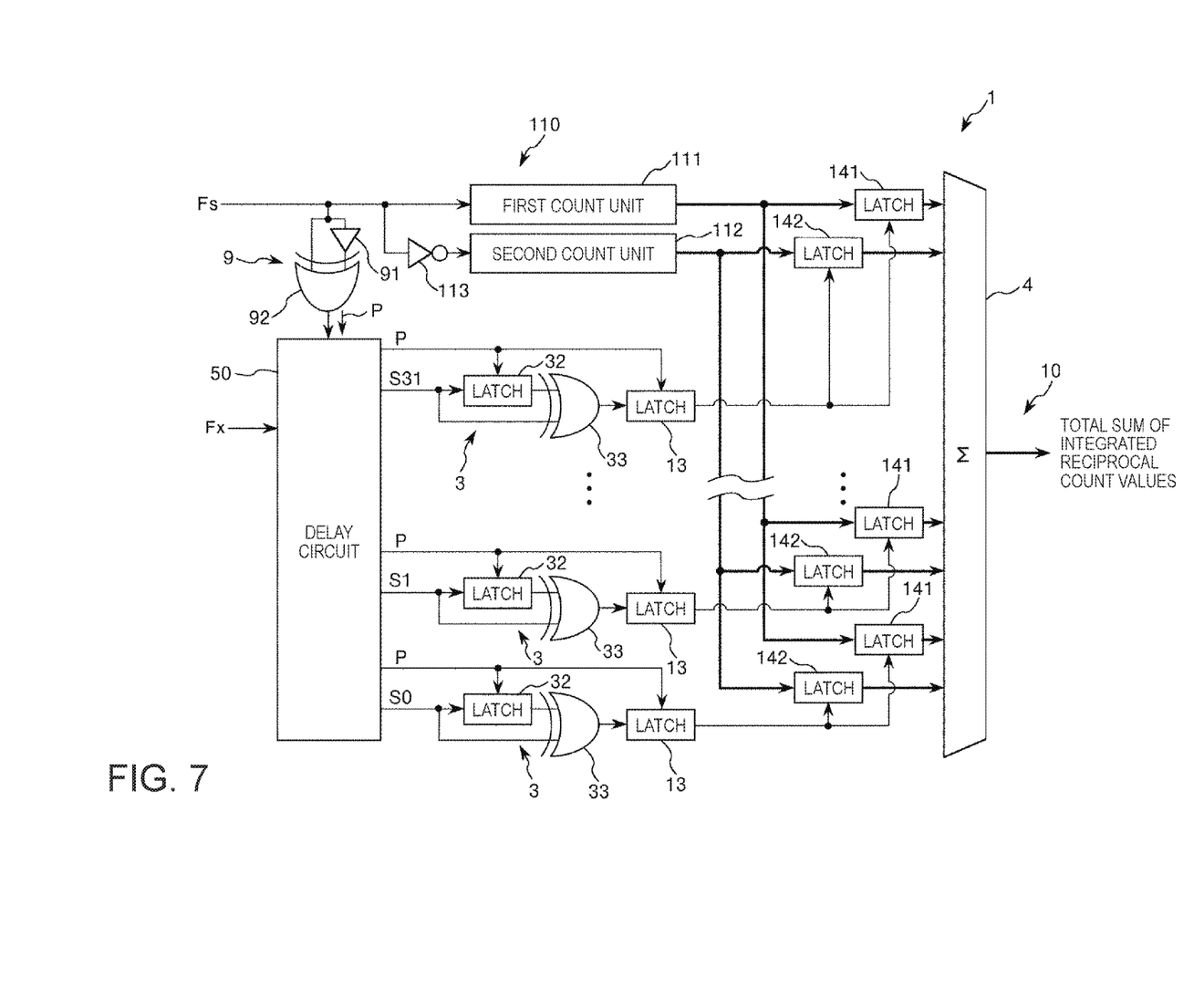
FIG. 7 is a block diagram illustrating a fourth embodiment of the reciprocal count value generation circuit which is one example of the count value generation circuit according to the invention.

FIG. 7 is a block diagram illustrating a fourth embodiment of the reciprocal count value generation circuit which is one example of the count value generation circuit according to the invention.

Hereinafter, the fourth embodiment will be described focusing on differences from the above-described embodiment. The description of the same matters will be omitted.

In the fourth embodiment, for the reference clock and the measurement signal, inversion of a signal occurs in both rising and falling of the signal.

A reciprocal count value generation circuit 1 according to the fourth embodiment includes an edge detection unit 9 which is one example of a detection circuit detecting rising and falling of the reference clock (Fs) and generating the pulse signal (P) synchronized with the rising and falling of the reference clock (Fs). A counter 110 which is one example of the second counter includes a first count unit 111 that counts rising of the reference clock (Fs) and a second count unit 112 that counts falling of the reference clock (Fs). The counter 3 (the first counter) detects an inversion edge using the pulse signal (P) detected by the edge detection unit 9. In the counter 110 (the second counter), the first count unit 111 counts the rising of the reference clock (Fs) and the second count unit 112 counts the falling of the reference clock (Fs) in the counting of the reference clock (Fs).

Thus, double frequencies can be counted effectively with the simple configuration, and thus it is possible to improve an SN ratio. Hereinafter, specific description will be made.

As illustrated in FIG. 7, the reciprocal count value generation circuit 1 according to the fourth embodiment includes the edge detection unit 9, the counter 110 which is one example of the second counter, the delay circuit 50, the plurality of counters 3 which are one example of the plurality of first counters, a plurality of latches 13, and a plurality of latches 141, a plurality of latches 142, and an adder 4.

The edge detection unit 9, the delay circuit 50, and each counter 3 are the same as those of the first or second embodiment, and thus the description thereof will be omitted.

The counter 110 includes the first count unit 111, the second count unit 112, and an inverter 113 (phase inversion circuit). The second count unit 112 is connected to the output side of the inverter 113. The first count unit 111 and a series circuit configured by the inverter 113 and the second count unit 112 are connected in parallel. An output terminal of the first count unit 111 is connected to an input terminal of each latch 141 and output terminal of the second count unit 112 is connected to an input terminal of each latch 142. The output terminal of each latch 141 and the output terminal of each latch 142 are connected to an input terminal of the adder 4. For example, an up-counter can be used as the first count unit 111 and the second count unit 112.

An output terminal of the edge detection unit 9 is connected to a clock input terminal of the latch 31 and a clock input terminal of the latch 32 of each counter 3 and a clock input terminal of each latch 13 (see FIGS. 4 and 7).

An output terminal of each counter 3 is connected to an input terminal of the latch 13 corresponding to the counter 3. The output terminal of each latch 13 is connected to a clock input terminal of the latch 141 and a clock input terminal of the latch 142 corresponding to the latch 13. For example, D latches can be used as the latches 13, 141, and 142.

A measurement signal is input to one input terminal of the exclusive OR circuit 56 of the delay circuit 50 (see FIG. 4).

A reference clock is input to an input terminal of the delay element 91 connected to one input terminal of the exclusive OR circuit 92 and the other input terminal of the exclusive OR circuit 92 of the edge detection unit 9, and the input terminal of the first count unit 111 and the input terminal of the inverter 113 of the counter 110.

Next, an operation of the reciprocal count value generation circuit 1 will be described.

As illustrated in FIG. 7, the operation is the same as that of the second embodiment until an operation performed halfway. Each counter 3 outputs "1" to correspond to the rising and falling of the measurement signal. Otherwise, each counter 3 outputs "0".

On the other hand, the reference clock is input to the counter 110. The first count unit 111 counts the rising edges of the reference clock and outputs the count value of the rising edges of the reference clock.

The phase of the reference clock is inverted by the inverter 113 to be input to the second count unit 112. The second count unit 112 counts the rising edges of the inverted reference clock obtained by inverting the phase of the reference clock, that is, the falling edges of the reference clock, and outputs the count value of the falling edges of the reference clocks.

The signal output from each counter 3 is latched and output in synchronization with the rising edge and the falling edge of the reference clock by the latch 13.

The count value output from the first count unit 111 is input to each latch 141. Each latch 141 latches and outputs the count value in synchronization with the rising edge of the signal output from the latch 13.

Similarly, the count value output from the second count unit 112 is input to each latch 142. Each latch 142 latches and outputs the count value in synchronization with the rising edge of the signal output from the latch 13.

Subsequently, the adder 4 adds and outputs the count values output from each latch 141 and each latch 142. This output is a total sum of the integrated reciprocal count values.

The detailed description of a subsequent operation will be omitted. However, for example, a difference between the total sum of the current integrated reciprocal count values and the total sum of the immediately previous integrated reciprocal count values is obtained and output. This output is a total sum of the reciprocal count values. A method of obtaining the total sum of the reciprocal count values is not limited to this method and another method may be used. As described in the first embodiment, for example, a filter such as a lowpass filter or a moving average filter may be provided.

Even in the foregoing fourth embodiment, it is possible to obtain the same advantages as those of the above-described embodiment.

Embodiment of Physical Quantity Sensor

Figure 8:
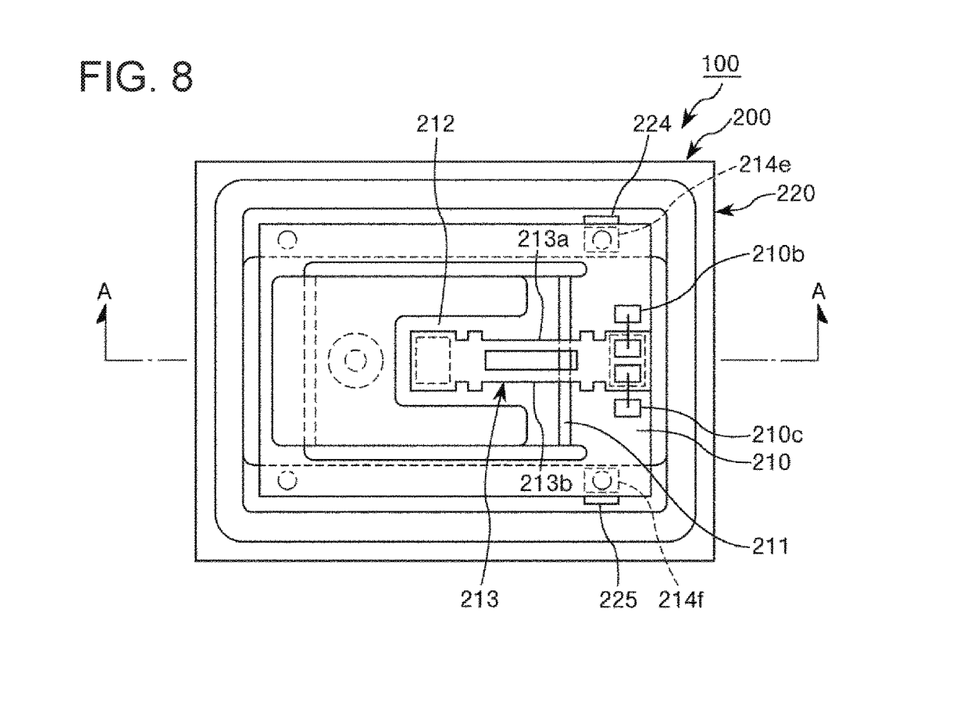
FIG. 8 is a diagram illustrating an internal structure of a detection unit in an embodiment of an acceleration sensor which is one example of a physical quantity sensor according to the invention.
Figure 9:
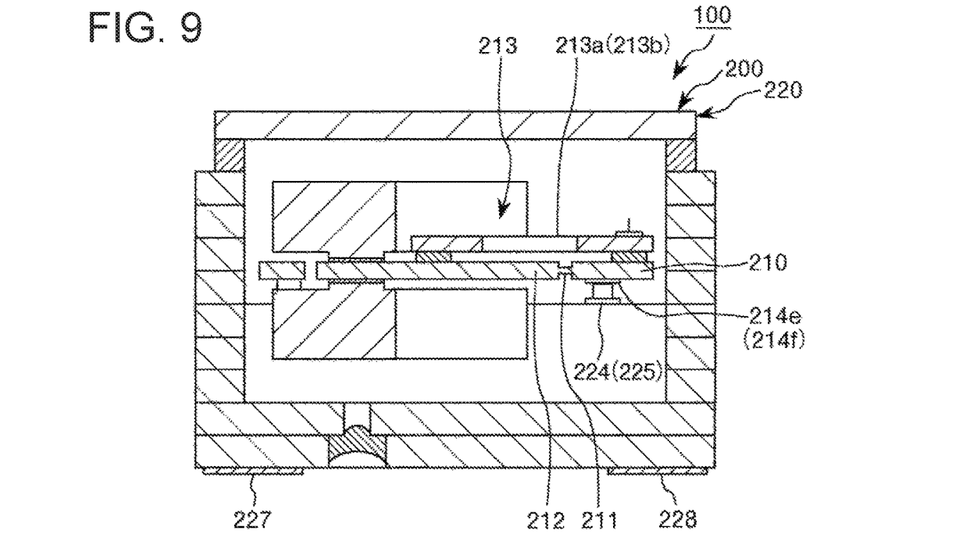
FIG. 9 is a sectional view taken along the line A-A of FIG. 8.

FIG. 8 is a diagram illustrating an internal structure of a detection unit in an embodiment of an acceleration sensor which is one example of a physical quantity sensor according to the invention. FIG. 9 is a sectional view taken along the line A-A of FIG. 8.

Hereinafter, an embodiment of an acceleration sensor which is one example of a physical quantity sensor will be mainly described focusing on differences from the above-described embodiment. The description of the same matters will be omitted.

As illustrated in FIGS. 8 and 9, an acceleration sensor 100 (physical quantity sensor) according to the invention includes a detection unit 200 that detects acceleration which is one example of a physical quantity of vibration and a reciprocal count value generation circuit 1 (see FIG. 1 and the like in regard to the reciprocal count value generation circuit 1) to which a measurement signal output from the detection unit 200 is input. The detection unit 200 and the reciprocal count value generation circuit 1 are electrically connected to each other. The reciprocal count value generation circuit 1 has been described above, and thus the description thereof will be omitted.

The detection unit 200 includes a base unit 210 that has a flat plate shape, a movable unit 212 that has a substantially rectangular flat plate and is connected to the base unit 210 via a joint unit 211, an acceleration detection element 213 which is one example of a physical quantity detection element joining to the base unit 210 and the movable unit 212, and a package 220 that accommodates at least these constituent elements therein.

In the detection unit 200, vibration beams 213a and 213b of the acceleration detection element 213 oscillate (resonate) at a predetermined frequency by a driving signal applied to an excitation electrode of the acceleration detection element 213 via external terminals 227 and 228, internal terminals 224 and 225, external connection terminals 214e and 214f, connection terminals 210b and 210c, and the like. Then, the detection unit 200 outputs a resonance frequency of the acceleration detection element 213 varying in accordance with applied acceleration as a measurement signal (detection signal).

The measurement signal is input to the reciprocal count value generation circuit 1. Then, the reciprocal count value generation circuit 1 operates in the manner described in the foregoing embodiments.

The number of detection units 200 is one in the embodiment, but the invention is not limited thereto. For example, two or three detection units may be used. By providing three detection units 200 and crossing (intersecting) detection axes of the detection units 200 one another, it is possible to detect acceleration in an axial direction of each of the three crossed detection axes.

Even in the foregoing acceleration sensor 100, the reciprocal count value generation circuit 1 including the acceleration sensor 100 can exert the same advantages as those of the above-described embodiments. Thus, the acceleration sensor 100 can detect acceleration with high precision.

The delay circuit, the count value generation circuit, and the physical quantity sensor according to the invention have been described above according to the illustrated embodiments, but the invention is not limited thereto. The configuration of each unit can be substituted with any configuration with the same function. Another arbitrary constituent may be added.

The invention may be realized by combining any two or more configurations (features) in the foregoing embodiments.

In the foregoing embodiment, the case in which the delay circuit is applied to the reciprocal count value generation circuit (the count value generation circuit) has been described as an example. In the invention, however, the uses of the delay circuit are not limited thereto and can be applied to various circuits or devices.

In the foregoing embodiment, the acceleration sensor has been described as an example of the physical quantity sensor. In the invention, the physical quantity sensor is not limited thereto as long as a device can detect a change in a physical quantity as a frequency change. For example, a mass sensor, an ultrasonic sensor, an angular velocity sensor, and a capacitance sensor can be exemplified.

The physical quantity sensor according to the invention can be applied to, for example, various electronic devices such as an inclinometer, a seismograph, a navigation device, an attitude control device, a game controller, a mobile phone, a smartphone, and a digital still camera and various moving objects such as automobiles. That is, the invention can provide an electronic device including the physical quantity sensor according to the invention and a moving object including the physical quantity sensor according to the invention.

The entire disclosure of Japanese Patent Application No. 2016-246005, filed Dec. 19, 2016 is expressly incorporated by reference herein.

What is claimed is:

1. A delay circuit comprising:
   a cyclic number control circuit being configured to:
      receive a trigger signal;
      generate a first signal in response to receipt of the trigger signal;
      count a number of times a second signal is transmitted in the cyclic number control circuit; and
      generate a third signal in response to the first and second signals;
   a loop circuit in which a plurality of delay elements are electrically connected in series, the third signal being input to the loop circuit so that a first delay element of the plurality of delay elements receives the third signal prior to a remainder of the plurality of delay elements, the first delay element being configured to delay the third signal so as to create a first delay signal, the first delay signal being input to a second delay element that is serially connected to the first delay element and located at a trailing end of the first delay element, the second delay element being configured to delay the first delay signal so as to create a second delay signal, one of the third signal, the first delay signal, and the second delay signal being selectively input to the cyclic number control circuit; and
   a latch circuit to which the first and second delay signals are input, the latch circuit being configured to generate first and second latch signals corresponding to the first and second delay signals, respectively, when a reference signal is input to the latch circuit so that the latch circuit holds one of the first and second delay signals for a first period of time, wherein the second signal is generated in response to the one of the third signal, the first delay signal, and the second delay signal, and wherein the cyclic number control circuit is configured to stop generating the third signal when the number of times the second signal is transmitted reaches a predetermined number.

2. The delay circuit according to claim 1, wherein the cyclic number control circuit includes a binary counter, a multiplexer, an exclusive OR circuit, and an AND circuit, the binary counter is configured to count the number of times the second signal is transmitted, the second signal passes through the binary counter so as to enter the multiplexer, the trigger signal and the second signal, which are output from the multiplexer, are input to the exclusive OR circuit, and an output signal from the exclusive OR circuit and the second signal are input to the AND circuit to generate the third signal.

3. The delay circuit according to claim 1, further comprising:

a selection switch configured to select one of the third signal, the first delay signal, and the second delay signal so that the selected one of the third signal, the first delay signal, and the second delay signal is input to the cyclic number control circuit.

4. The delay circuit according to claim 1, wherein a first occurrence of the second signal being transmitted and a second occurrence of the second signal being transmitted in the cyclic number control circuit are separated by a second period of time, and the second period of time is longer than the first period of time.

5. A count value generation circuit comprising:

the delay circuit according to claim 1;

a plurality of counters which are electrically connected in parallel, the first and second latch signals being input to first and second counters of the plurality of counters, respectively, the plurality of counters detecting inversion edges of the first and second latch signals by using the reference signal, each of the plurality of counters generating a count signal; and a count value generation element configured to generate a count value in response to the count signals from the plurality of counters.

6. A count value generation circuit comprising:

the delay circuit according to claim 2;

a plurality of counters which are electrically connected in parallel, the first and second latch signals being input to first and second counters of the plurality of counters, respectively, the plurality of counters detecting inversion edges of the first and second latch signals by using the reference signal, each of the plurality of counters generating a count signal; and a count value generation element configured to generate a count value in response to the count signals from the plurality of counters.

7. A count value generation circuit comprising:

the delay circuit according to claim 3;

a plurality of counters which are electrically connected in parallel, the first and second latch signals being input to first and second counters of the plurality of counters, respectively, the plurality of counters detecting inversion edges of the first and second latch signals by using the reference signal, each of the plurality of counters generating a count signal; and a count value generation element configured to generate a count value in response to the count signals from the plurality of counters.

8. A count value generation circuit comprising:

the delay circuit according to claim 4;

a plurality of counters which are electrically connected in parallel, the first and second latch signals being input to first and second counters of the plurality of counters, respectively, the plurality of counters detecting inversion edges of the first and second latch signals by using the reference signal, each of the plurality of counters generating a count signal; and a count value generation element configured to generate a count value in response to the count signals from the plurality of counters.

9. The count value generation circuit according to claim 5, wherein the count value is a reciprocal count value.

10. A physical quantity sensor comprising:

the count value generation circuit according to claim 5; and a detection element configured to detect a physical quantity so as to output a measurement signal, wherein the measurement signal is input to the count value generation circuit.

11. A physical quantity sensor comprising:

the count value generation circuit according to claim 6; and a detection element configured to detect a physical quantity so as to output a measurement signal, wherein the measurement signal is input to the count value generation circuit.

12. A physical quantity sensor comprising:

the count value generation circuit according to claim 7; and a detection element configured to detect a physical quantity so as to output a measurement signal, wherein the measurement signal is input to the count value generation circuit.

13. A physical quantity sensor comprising:

the count value generation circuit according to claim 8; and a detection element configured to detect a physical quantity so as to output a measurement signal, wherein the measurement signal is input to the count value generation circuit.

14. A physical quantity sensor comprising:

the count value generation circuit according to claim 9; and a detection element configured to detect a physical quantity so as to output a measurement signal, wherein the measurement signal is input to the count value generation circuit.

15. The physical quantity sensor according to claim 10, wherein the physical quantity corresponds to vibration.

* * * * *